United States Patent
Kwak et al.

(10) Patent No.: US 9,074,055 B2
(45) Date of Patent: Jul. 7, 2015

(54) METHOD OF MANUFACTURING NANOSTRUCTURE AND METHOD OF FORMING PATTERN USING THE SAME

(71) Applicants: Samsung Display Co., Ltd., Yongin (KR); KOREA UNIVERSITY RESEARCH AND BUSINESS FOUNDATION, Seoul (KR)

(72) Inventors: Eun-Ae Kwak, Gunpo-si (KR); Min-Hyuck Kang, Seoul (KR); Su Mi Lee, Hwaseong-si (KR); Jun Han Lee, Incheon (KR); Moon Gyu Lee, Suwon-si (KR); Joona Bang, Seoul (KR); Hyun Jung Jung, Seoul (KR)

(73) Assignees: Samsung Display Co., Ltd., Yongin (KR); Korea University Research and Business Foundation, Seoul (KR)

( * ) Notice: Subject to any disclaimer, the term of this patent is extended or adjusted under 35 U.S.C. 154(b) by 0 days.

(21) Appl. No.: 13/870,473

(22) Filed: Apr. 25, 2013

(65) Prior Publication Data

US 2014/0158664 A1    Jun. 12, 2014

(30) Foreign Application Priority Data

Dec. 7, 2012  (KR) .................. 10-2012-0141737

(51) Int. Cl.
| | | |
|---|---|---|
| C03C 15/00 | (2006.01) | |
| C08J 7/04  | (2006.01) | |
| G03F 7/00  | (2006.01) | |
| G03F 7/26  | (2006.01) | |

(52) U.S. Cl.
CPC ................. *C08J 7/04* (2013.01); *G03F 7/0002* (2013.01); *G03F 7/26* (2013.01)

(58) Field of Classification Search
None
See application file for complete search history.

(56) References Cited

U.S. PATENT DOCUMENTS

| | | | |
|---|---|---|---|
| 5,187,244 A * | 2/1993 | Sugimori et al. | ............. 525/479 |
| 2008/0233435 A1 * | 9/2008 | Hasegawa et al. | ............ 428/826 |
| 2010/0151393 A1 * | 6/2010 | Kim et al. | .................... 430/322 |

\* cited by examiner

*Primary Examiner* — Shamim Ahmed
*Assistant Examiner* — Bradford Gates
(74) *Attorney, Agent, or Firm* — H.C. Park & Associates, PLC

(57) ABSTRACT

An approach is provided for manufacturing a nanostructure. A first thin film including a first block copolymer is formed on a substrate. A guide pattern is formed on the first thin film. A second thin film including a second block copolymer is formed between portions of the guide pattern. The second thin film is cured. The first block copolymer is a cylinder-type and the second block copolymer is a lamella-type.

19 Claims, 11 Drawing Sheets

METHOD OF MANUFACTURING NANOSTRUCTURE AND METHOD OF FORMING PATTERN USING THE SAME

CROSS-REFERENCE TO RELATED APPLICATION

This application claims priority from and the benefit of Korean Patent Application No. 10-2012-0141737, filed on Dec. 7, 2012, which is incorporated by reference for all purposes as if set forth herein.

BACKGROUND

1. Field

Exemplary embodiments relate to nanostructures, and more particularly, to manufacturing nanostructures and forming a pattern using the same.

2. Discussion

In nature, organisms including a hierarchiral structure through self-assembly are abundant. As such, methods of chemically generating nanostructures formed via the organism are receiving attention. It is noted that self-assembly is also found in block copolymers, which can be organically and chemically synthesized.

Block copolymers are a kind of polymer material, and have a form including ends of two or more polymers being connected to each other through a covalent bond. In diblock copolymers, two polymers having different properties are connected to each other to form one polymer. The two polymers that are connected to each other may be easily phase-separated due to different material properties, and the block copolymer may be self-assembled to form a nanostructure.

To broaden practical utilization of nanostructures manufactured via block copolymers, a thin film is typically formed on a substrate upon which a stable nanostructure is formed. Nanostructures formed in this manner, however, are typically different from those formed in a bulk phase or the nanostructures are arranged in an undesired form due to interactions between the self-assembly material and the substrate. In order to address these issues, methods have been developed to adjust alignment or arrangement of the nanostructures with respect to a sample in a thin film state. For instance, an electric field or a method, such as epitaxial self-assembly and graphoepitaxy, may be used to adjust the alignment or arrangement of the nanostructures. However, uniformly forming the nanostructures on a substrate including a large area remains challenging.

Therefore, there is a need for an approach that provides efficient, cost effective techniques to control the self-assembly of uniform, highly aligned nanostructures.

The above information disclosed in this Background section is only for enhancement of understanding of the background of the invention, and therefore, it may contain information that does not form the prior art that is already known in this country to a person of ordinary skill in the art.

SUMMARY

Exemplary embodiments provide a method of manufacturing uniform, highly aligned nanostructures and patterns of the same.

Additional aspects will be set forth in the detailed description which follows and, in part, will be apparent from the disclosure, or may be learned by practice of the invention.

According to exemplary embodiments, a method of manufacturing a nanostructure, includes: forming, on a substrate, a first thin film including a first block copolymer; forming a guide pattern on the first thin film; forming a second thin film including a second block copolymer between portions of the guide pattern; and curing the second thin film. The first block copolymer is a cylinder-type and the second block copolymer is a lamella-type.

According to exemplary embodiments, a method of forming a pattern of nanostructures, includes: forming, on a target pattern layer, a first thin film including a first block copolymer, the target pattern layer being disposed on a substrate; forming a guide pattern on the first thin film; forming a second thin film including a second block copolymer between portions of the guide pattern; curing the second thin film to form a sacrificial structure including a first sacrificial block and a second sacrificial block; removing the first sacrificial block from the sacrificial structure; and patterning the first thin film and the target pattern layer using the second sacrificial block and the guide pattern as a mask. The first block copolymer is a cylinder-type and the second block copolymer is a lamella-type.

According to exemplary embodiments, it is possible to increase alignment of a lamella-type block copolymer by forming a cylinder-type block copolymer that is not aligned before the lamella-type block copolymer is formed.

The foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
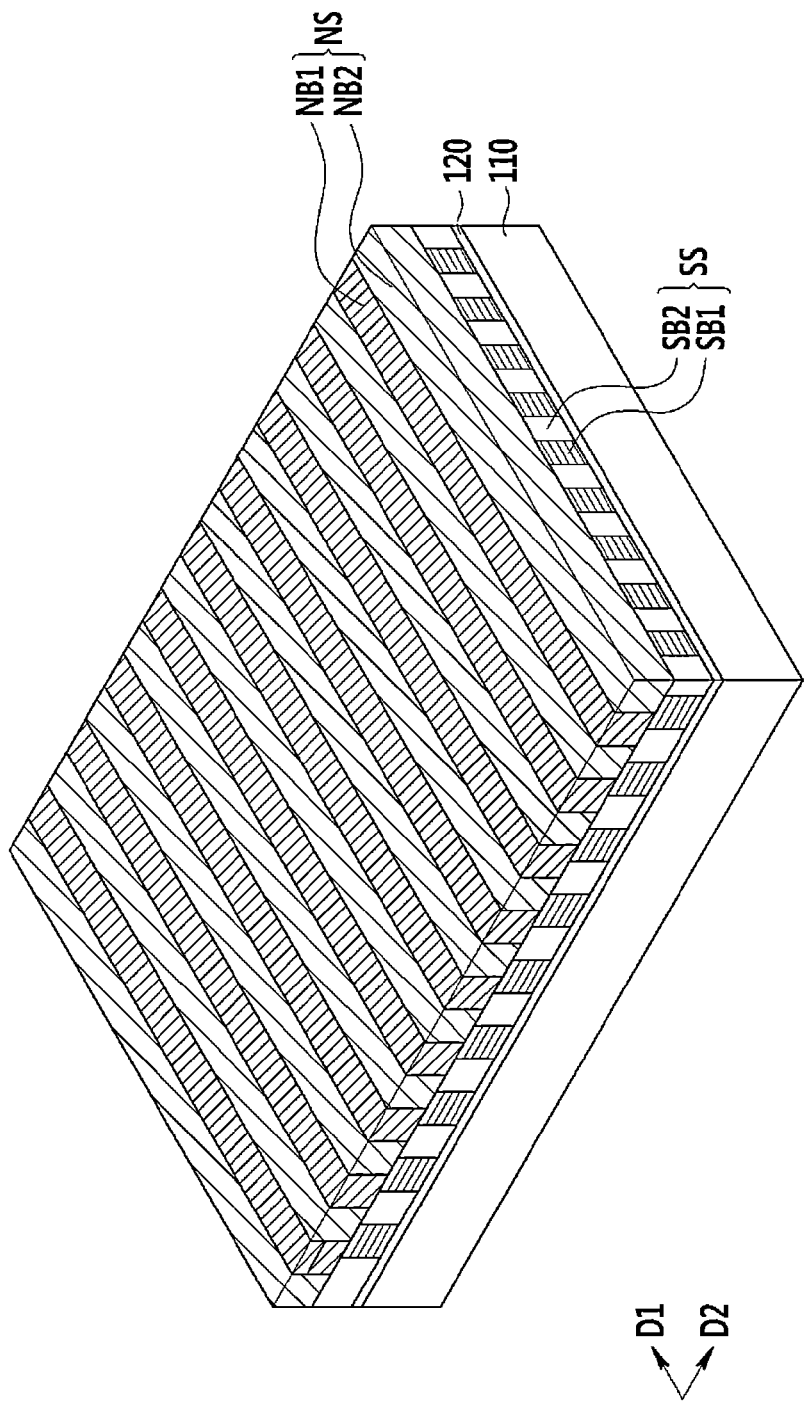
FIG. 1 is a perspective view of a nanostructure, according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers and/or sections, these elements, components, regions, layers and/or sections should not be limited by these terms. These terms are used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper," and/or the like, may be used herein for descriptive purposes, and thereby, to describe one element or feature's relationship to another element(s) or feature(s) as illustrated in the drawings. Spatially relative terms are intended to encompass different orientations of an apparatus in use or operation in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and as such, the spatially relative descriptors used herein interpreted accordingly.

The terminology used herein is for the purpose of describing particular embodiments and is not intended to be limiting. As used herein, the singular forms "a," "an," and "the" are intended to include the plural forms as well, unless the context clearly indicates otherwise. Moreover, the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a perspective view of a nanostructure, according to exemplary embodiments.

Referring to FIG. 1, a neutralization (or intermediate) layer 120 is positioned on a substrate 110. Cylinder blocks SB1 and SB2 formed on the neutralization layer 120 may be stably grown in a vertical direction that is vertical (or substantially vertical) to a surface of the substrate 110, e.g., normal (or substantially normal) of a surface of the substrate 110. According to exemplary embodiments, the neutralization layer 120 does not exhibit hydrophilicity or hydrophobicity, and thereby, exhibits chemical neutralization.

Although it is not illustrated, the neutralization layer 120 may include a self-assembled monolayer (SAM), a polymer brush, and a cross-linked random copolymer mat (MAT), or an organic monolayer including the MAT.

According to exemplary embodiments, the self-assembled monolayer may be formed from and/or include: phenethyltrichlorosilane (PETCS), phenyltrichlorosilane (PTCS), benzyltrichlorosilane (BZTCS), tolyltrichlorosilane (TTCS), 2-[(trimethoxysilyl)ethyl]-2-pyridine (PYRTMS), 4-biphenylyltrimethoxysilane (BPTMS), octadecyltrichlorosilane (OTS), 1-naphthyltrimehtoxysilane (NAPTMS), 1-[(trimethoxysilyl)methyl]naphthalene (MNATMS), (9-methylanthracenyl)trimethoxysilane (MANTMS), or the like.

The polymer brush may include, for example, polystyrene-random-poly(methylmethacrylate) (PS-r-PMMA).

The MAT may include, for instance, a benzocyclobutene-functionalized polystyrene-random-poly(methacrylate) copolymer (P(S-r-BCB-r-MMA)), or any other suitable MAT material.

Although not illustrated, before the neutralization layer 120 is formed, the surface of the substrate 110 may be pretreated using an acid solution. Affinity between the substrate 110 and the neutralization layer 120 may be improved by the pretreatment. The acid solution may include, for example, a hydrofluoric (HF) acid, or any other suitable pretreatment acid solution.

According to exemplary embodiments, a cylinder structure SS is formed on the neutralization layer 120. The cylinder structure SS includes a first cylinder block SB1 and a second cylinder block SB2, each being formed on the neutralization layer 120. In exemplary embodiments, the cylinder structure SS includes a cross-linked material, such as, for example, at least one of ketene, azide, and benzocyclobutene (BCB).

In exemplary embodiments, the cylinder structure SS including the cross-linked material forms a first block copolymer, and a lamella (or thin-plate-like)-type structure NS including a plurality of first nano blocks NB1 and a plurality of second nano blocks NB2 formed on the cylinder structure SS. In this manner, the lamella-type structure NS forms a first thin film on the cylinder structure SS.

The first plurality of nano blocks NB1 extend in a first direction D1 of the substrate 110, and are disposed in a second direction D2 that is different from the first direction D1. In this manner, the plurality of first nano blocks NB1 may be spaced apart from each other. According to exemplary embodiments, the second direction D2 may be perpendicular (or substantially perpendicular) to the first direction D1. The plurality of second nano blocks NB2 extend in the first direction D1, and are disposed in the second direction D2. As such, the plurality of second nano blocks NB2 may be spaced apart from each other. Ones of the plurality of second nano blocks NB2 may be interlaced (or otherwise disposed between) adjacent ones of the plurality of first nano blocks NB1.

According to exemplary embodiments, the plurality of first nano blocks NB1 may be formed from and/or include, for example, poly(methylmethacrylate) (PMMA), poly(ethylene oxide) (PEO), poly(vinyl pyridine) (PVP), poly(ethylene-alt-propylene) (PEP), polyisoprene (PI), or the like. The plurality of second nano blocks NB2 may be formed from and/or include polystyrene. In this manner, the nanostructure NS may be formed using a block copolymer where a polymer of the plurality of first nano blocks NB1 and polystyrene of the plurality of second nano blocks NB2 are mixed at a composition ratio of about 50:50.

A method of manufacturing nanostructure NS will be described in more detail in associating with FIGS. 2-6.

FIGS. 2-6 are perspective views of a method of manufacturing a nanostructure, according to exemplary embodiments.

Figure 2:
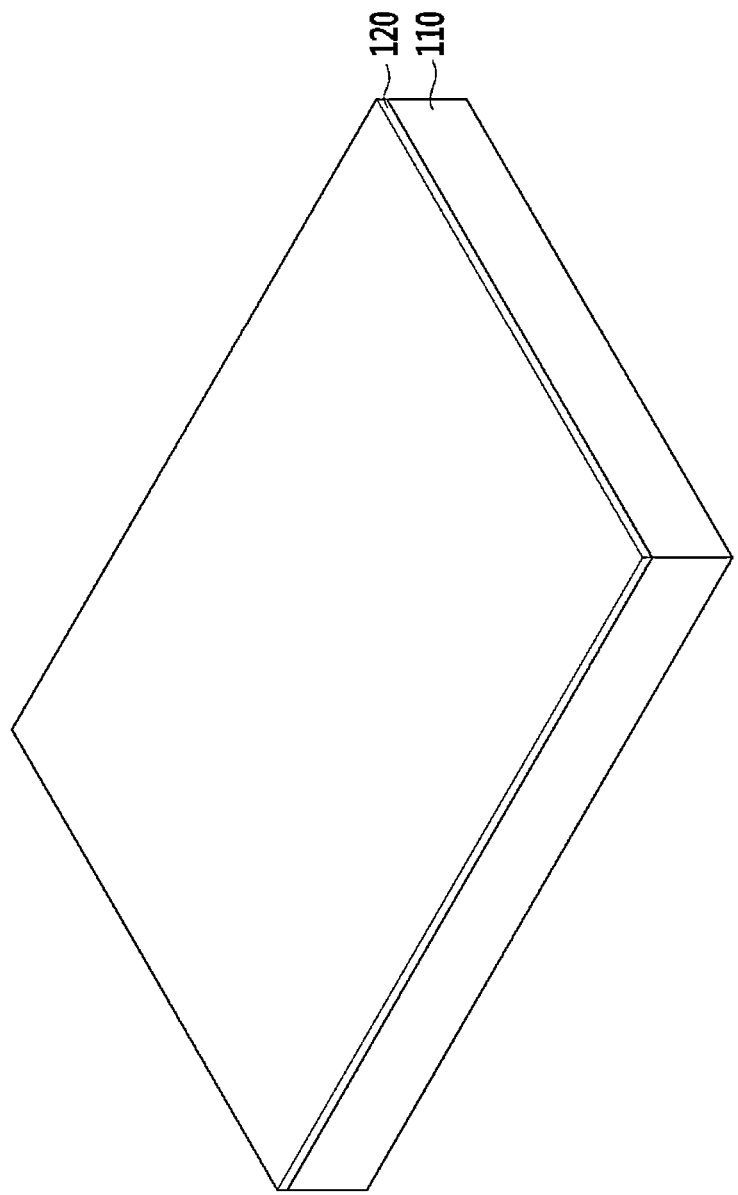
FIGS. 2-6 are perspective views of a method of manufacturing a nanostructure, according to exemplary embodiments.

Referring to FIG. 2, the neutralization layer 120 is formed on the substrate 110. The substrate 110 may include any suitable substrate, such as, for example, a glass substrate. The neutralization layer 120, as described above, may not exhibit hydrophilicity or hydrophobicity, and thereby, may exhibit chemical neutralization. To this end, the neutralization layer 120 may be formed of or include a SAM, a polymer brush, and a MAT or an organic monolayer including the MAT.

Although not illustrated, before the neutralization layer 120 is formed, the surface of the substrate 110 may be pre-treated using an acid solution, such as, for example, HF acid.

Figure 3:
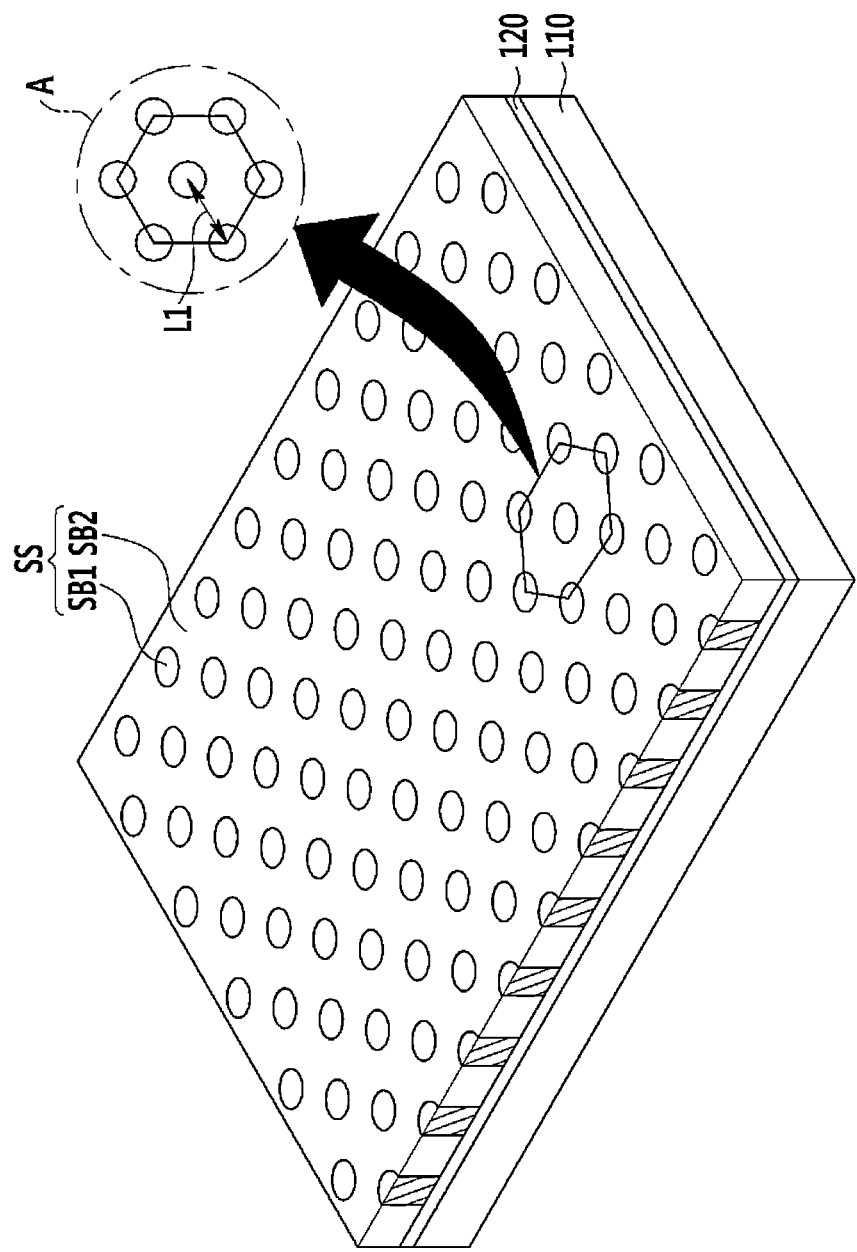

Referring to FIG. 3, the cylinder structure SS is formed on the neutralization layer 120. The cylinder structure SS may be formed by synthesizing the aforementioned cross-linked material to form a cross-linked block copolymer. The cross-linked material may include at least one of ketene, azide, and BCB.

The cross-linked block copolymer including ketene may be a compound represented by the following chemical formula:

Chemical Formula 1

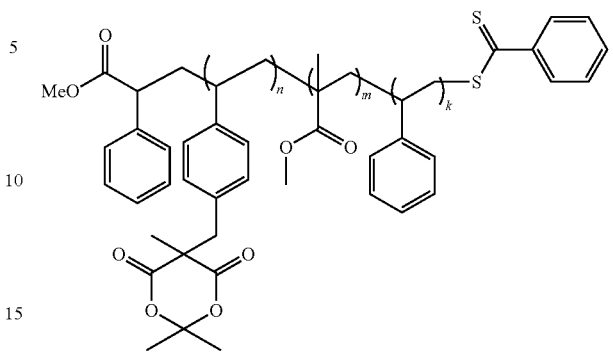

It is noted that "m" may range from (or about) 50 to (or about) 500, "k" may range from (or about) 50 to (or about) 500, and "n" may range from (or about) 1 to (or about) 40.

For example, the ketene-based block copolymer may be synthesized based on the following reaction equations:

Reaction Equation 1

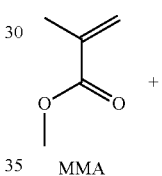

MMA

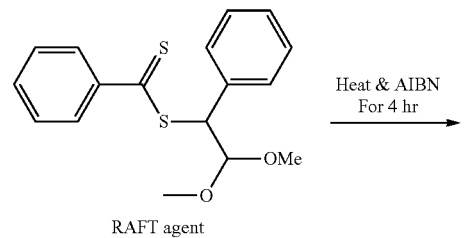

RAFT agent

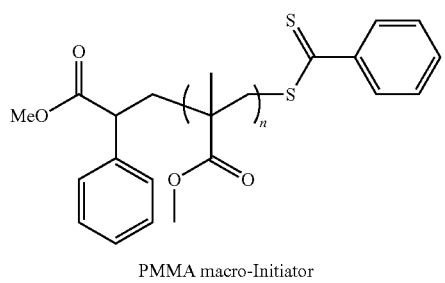

PMMA macro-Initiator

Reaction Equation 2

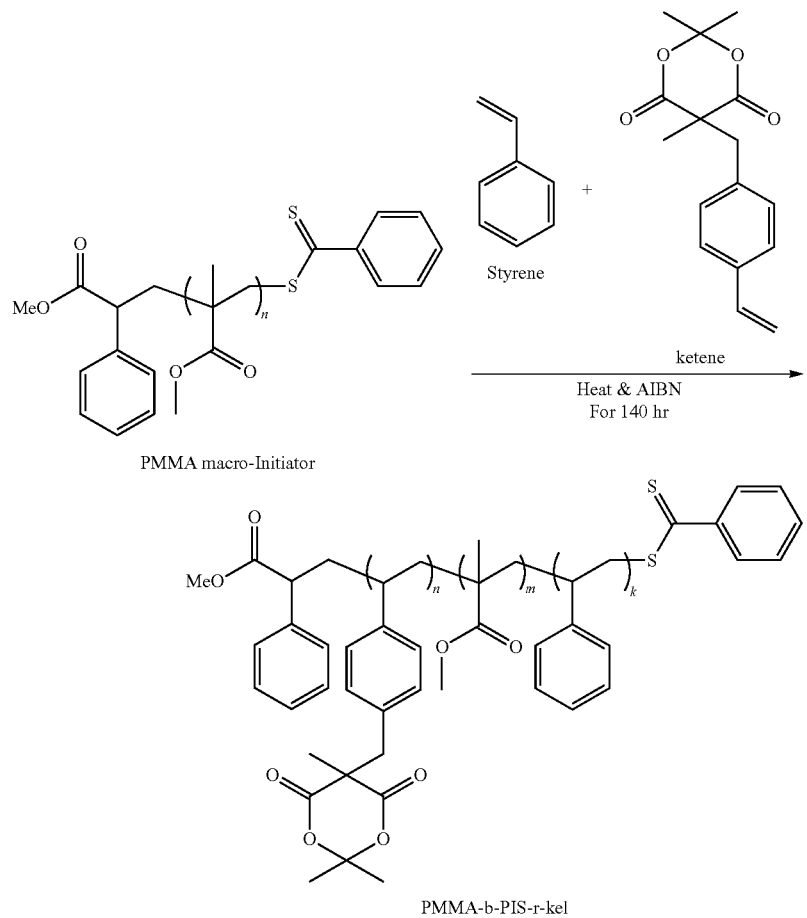

PMMA-b-PIS-r-kel

Monomers including a RAFT agent including methyl methacrylate (MMA) and xanthate may be subjected to RAFT polymerization to synthesize a copolymer. To this end, it is noted that "AIBN" is 2,2'-azobis(2-methylpropionitrile), "m" is 50 to 500, "n" is 50 to 500, and "k" is 1 to 40. If heat at approximately 200 to 300° C. is applied via thermal baking, a plurality of ketenes is reacted with each other to form a cross-linked bond, e.g., a cross-linked covalent bond.

In Reaction Equation 1, a number average molecular weight of a PMMA macro-initiator may range from (or about) 1 to (or about) 100 kg/mol, and a polydispersity index (PDI) thereof may be (or about) 1.9.

In Reaction Equation 2, a number average molecular weight of a ketene-based block copolymer may range from (or about) 10 to (or about) 100 kg/mol, and the content of ketene may be adjusted between (or about) 1 and (or about) 20 mol %. Further, in exemplary embodiments, the mixing amount of added ketene and polystyrene and a volume fraction of PMMA in Reaction Equation 2 may be adjusted to 7:3 to form a cylinder-type block copolymer.

In Reaction Equations 1 and 2, cross-link bonding may occur through one or more heat treatments (e.g., thermal baking, etc.), and thus, the cylinder structure SS may exhibit a resistance to an organic solvent and the like, which may be used in a subsequent process. It is contemplated, however, that one or more light treatments, e.g., ultraviolet (UV) ray treatment(s), may be performed in addition to or instead of the heat treatment(s).

As illustrated in FIG. 3, the cylinder structure SS includes the first cylinder block SB1 and the second cylinder block SB2. The first cylinder block SB1 may include PMMA, and the second cylinder block SB2 may include PS. As shown, the second cylinder block SB2 may be a substrate matter substantially surrounding the first cylinder block SB1. According to exemplary embodiments, the cylinder structure SS may form a hexagonal-type unit body A. The hexagonal-type unit body A may exhibit a first interval L1, which is the distance between centers of adjacently disposed first cylinder blocks SB1.

Figure 4:
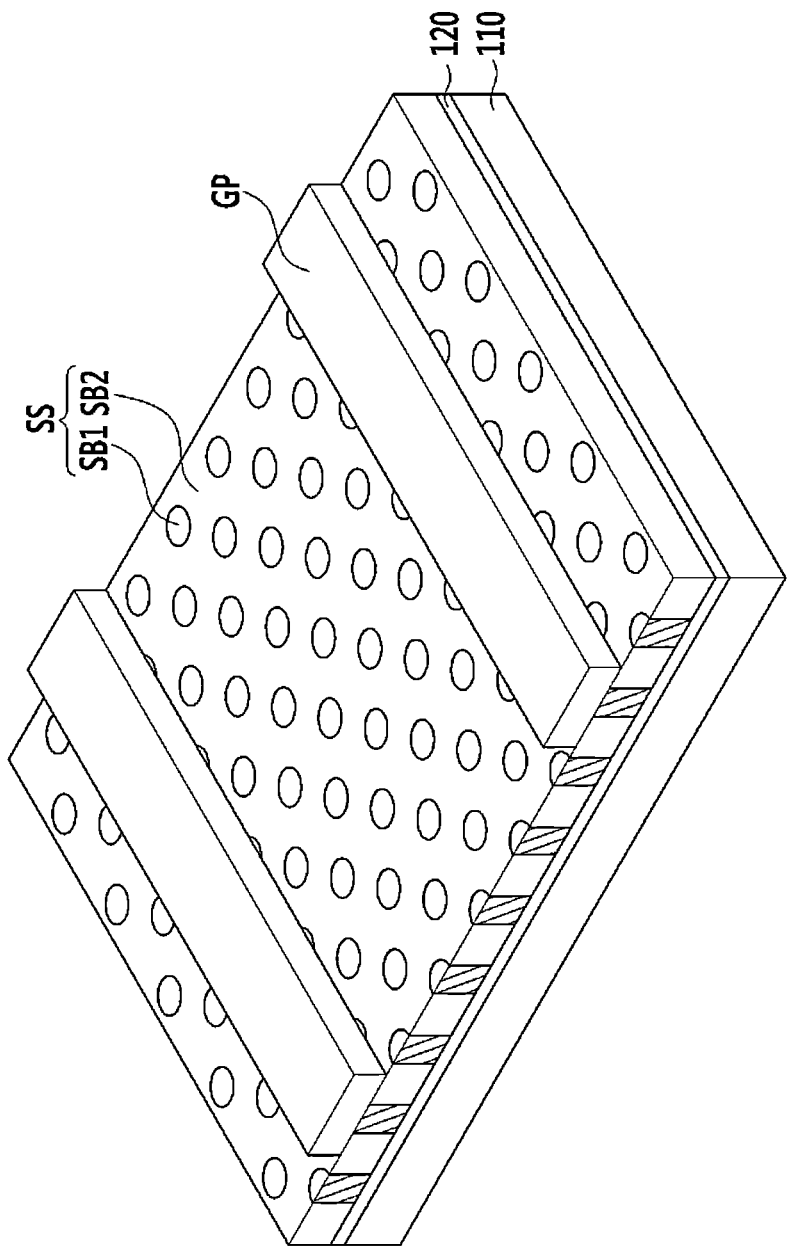

Referring to FIG. 4, a guide pattern GP is formed on the cylinder structure SS. The guide pattern GP may be formed using one or more suitable patterning processes, such as a photolithography process using a photoresist. In this manner, the guide pattern GP may be formed of the photoresist material, and as such, may be formed by forming a photoresist layer on the cylinder structure SS and illuminating the photoresist layer with light through a photomask (or reticle) to develop the photoresist layer. Alternatively, the guide pattern GP may be formed by a nano imprint process, or the like.

According to exemplary embodiments, the guide pattern GP is configured to adjust the directivity of a second block copolymer, which is to be subsequently formed. The distance between the guide patterns GP may be about 1 um or less. However, when the guide pattern GP is formed via the above-noted photolithography process, the distance may be 1.5 um or more, depending on the patterning limitations (or patterning resolution) of the photolithographic equipment.

Figure 5:
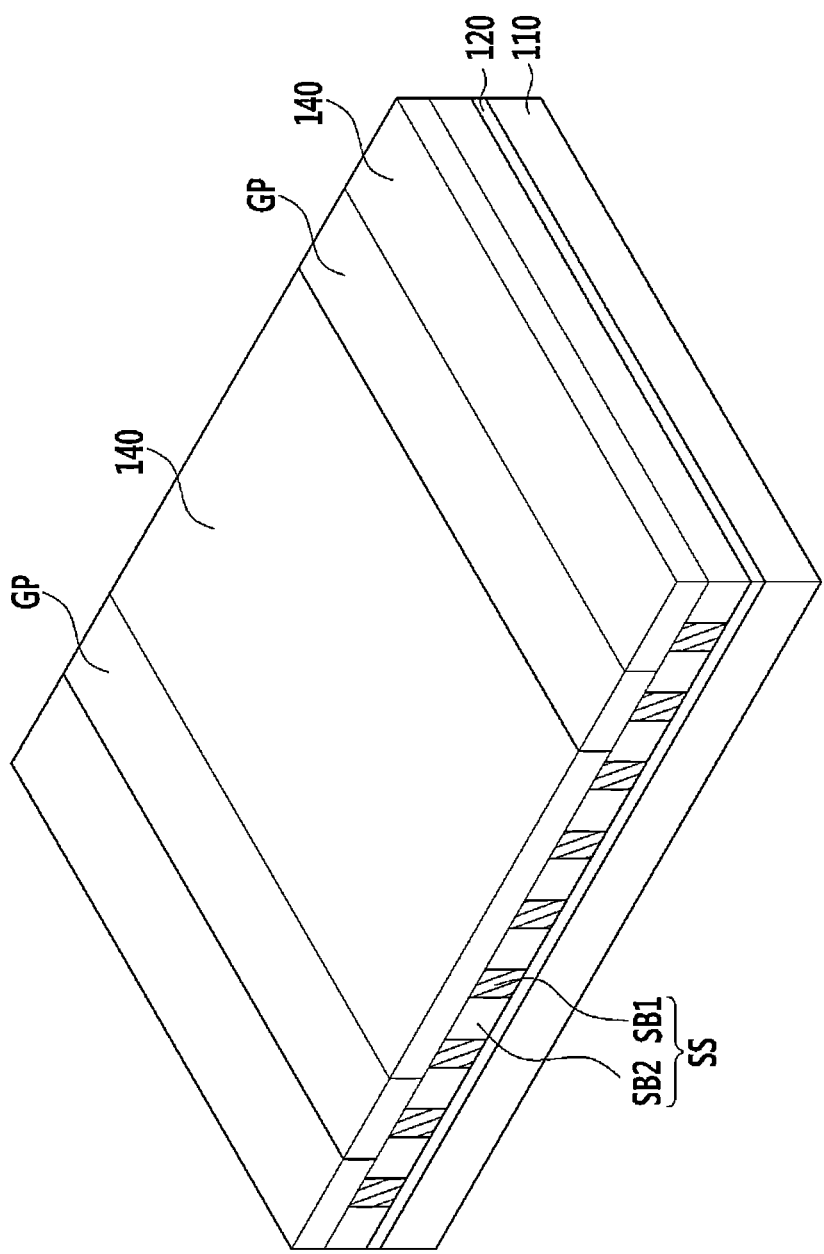

Referring to FIG. 5, a second thin film 140 is formed by disposing a second block copolymer on the cylinder structure SS between the guide patterns GP by, for example, a spin coating method, and/or the like. The second block copolymer may be a polymer including two different kinds of monomers that are covalently-bonded. The two different kinds of monomers may exhibit different physical and chemical properties. According to exemplary embodiments, the first monomer may exhibit relative hydrophilicity as compared to the second monomer, and the second monomer may exhibit relative hydrophobicity as compared to the first monomer. The second block copolymer, according to exemplary embodiments, may include polystyrene and a polymer covalently bonded to polystyrene.

The second block copolymer 140 may include polystyrene-block-poly(methylmethacrylate) (PS-b-PMMA), polystyrene-block-poly(ethylene oxide) (PS-b-PEO), polystyrene-block-poly(vinylpyridine) (PS-b-PVP), polystyrene-block-poly(ethylene-alt-propylene) (PS-b-PEP), polystyrene-block-polyisoprene (PS-b-PI), and/or the like.

Figure 6:
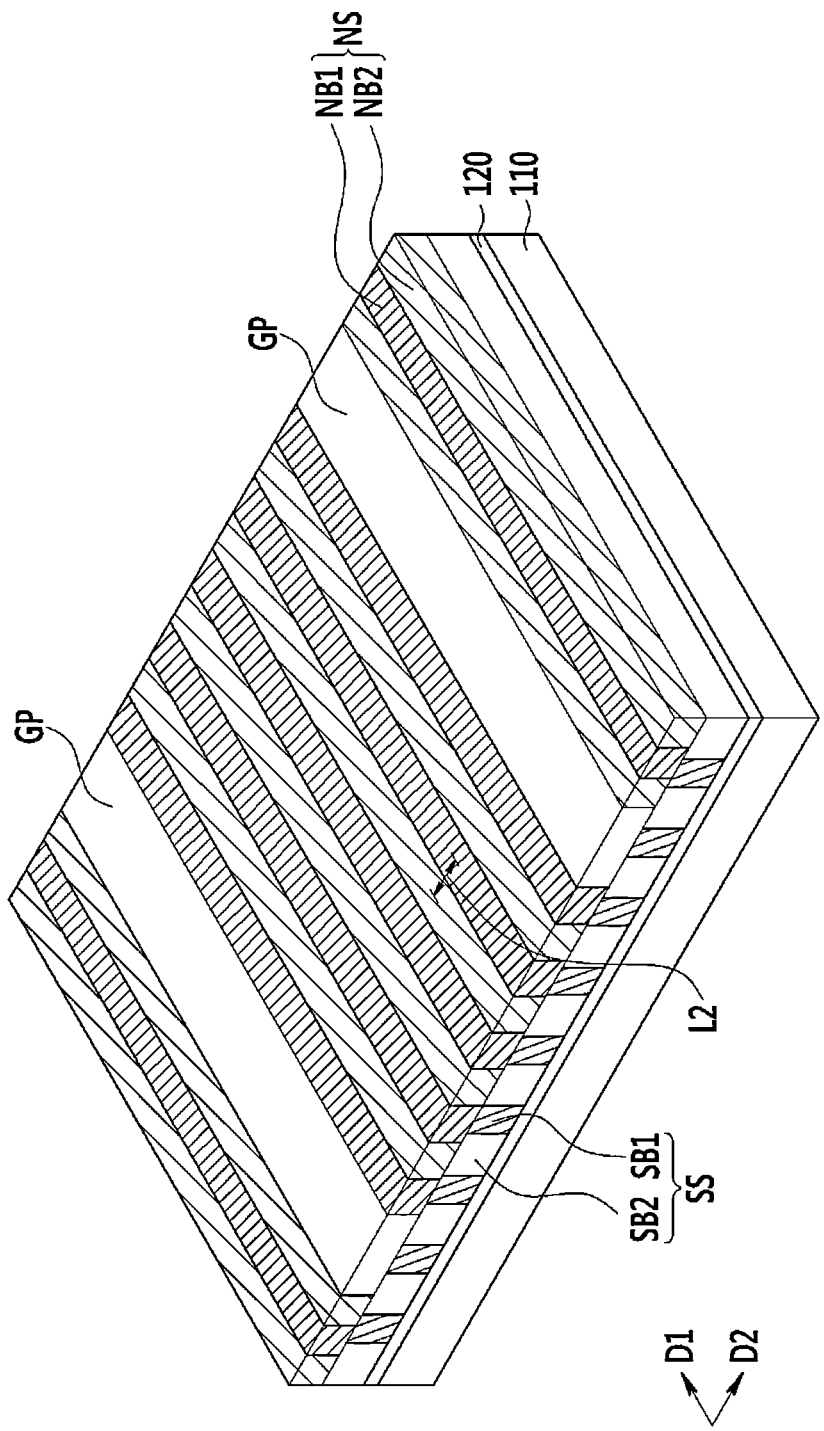

Referring to FIG. 6, the substrate 110 including the second thin film 140 is heat treated. The heat treatment process may be performed at about 200° C. or more, e.g., about 300° C., under a nitrogen gas ($N_2$) environment or vacuum condition for about 2 hours or more. Additionally or alternatively, one or more light treatments (e.g., UV ray treatment(s)) may be performed in addition to or instead of the heat treatment(s). As a result of the heat/UV treatment, the second thin film 140 is converted into the lamella structure NS including the first nano block NB1 and the second nano block NB2. Hereinafter, the first nano block NB1, the second nano block NB2, and the lamella structure NS will be described as a first sacrificial block, a second sacrificial block, and a sacrificial structure, respectively.

The sacrificial structure NS is aligned in the first direction D1 and is phase-separated into polystyrene and polymer in the second direction D2. Accordingly, the first sacrificial block NB1 extending in the first direction D1 is formed, and the second sacrificial block NB2 that is phase-separated from the first sacrificial block NB1 to be disposed in the second direction D2 of the first sacrificial block NB1 is formed. In exemplary embodiments, the first sacrificial block NB1 includes PS, and the second sacrificial block NB2 includes PMMA.

The second block copolymer includes different shapes according to the composition ratio of the first and the second monomers. When the composition ratio of polystyrene and PMMA is about 50:50, the sacrificial structure NS has a lamella shape.

According to exemplary embodiments, a second interval L2 representing an interval between the first sacrificial block NB1 and the second sacrificial block NB2 may be is substantially the same as a first interval L1 (illustrated in FIG. 3) of the cylinder structure SS. In this manner, if the ratio of the first interval L1 and the second interval L2 (i.e., the distance between respective longitudinal axes of the first sacrificial block NB1 and the second sacrificial block NB2) is approximately 1:1, the alignment of the lamella structure NS may be increased. This will be described in more detail with reference to FIG. 11.

According to exemplary embodiments, the nano structure including the lamella structure NS is formed on the cylinder structure SS on the substrate 110.

A method of forming a pattern using the aforementioned nano structure will be described in more detail in association with FIGS. 7 and 8.

Figure 7:
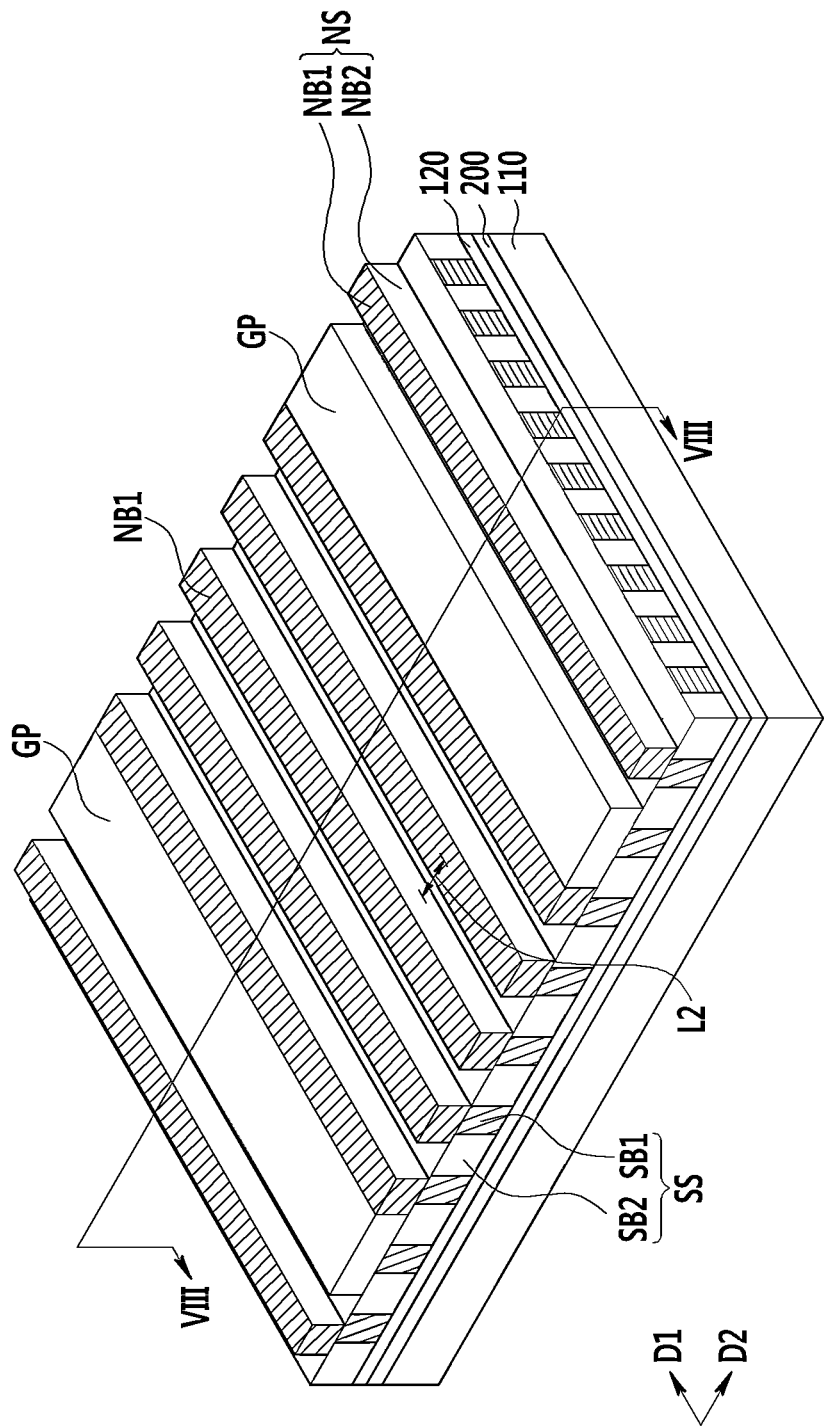
FIGS. 7 and 8 are a perspective view and a cross-sectional view of a method of forming a pattern, according to exemplary embodiments.
Figure 8:
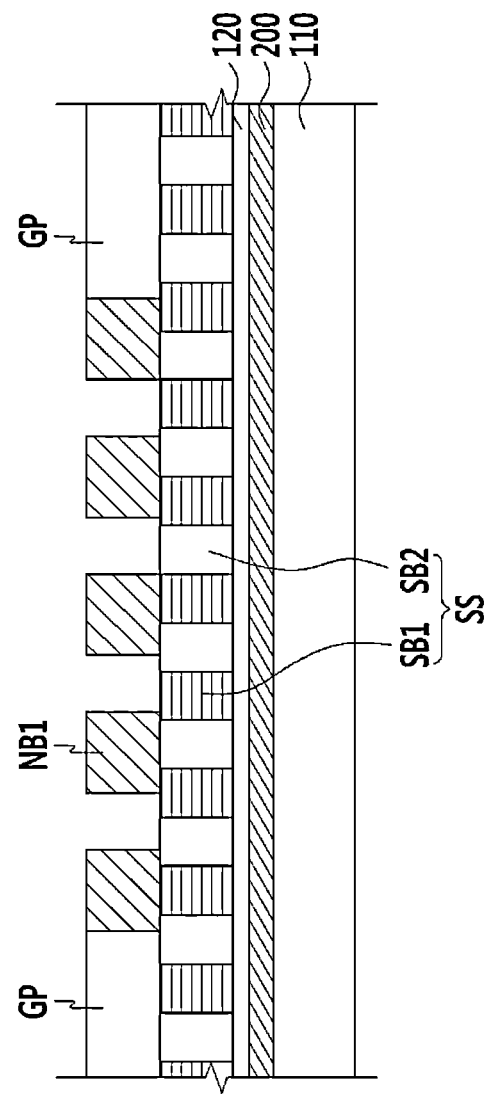

FIGS. 7 and 8 are a perspective view and a cross-sectional view of a method of forming a pattern, according to exemplary embodiments. It is noted that FIG. 8 is a cross-sectional view of the structure of FIG. 7 taken along sectional line VIII-VIII.

Referring to FIGS. 7 and 8, in the aforementioned method of manufacturing a nanostructure, before the neutralization layer 120 or the cylinder structure SS is formed, a mother pattern layer 200 that is a target layer for forming the pattern is formed on the substrate 110. After mother pattern layer 200 is formed, the same process as previously described is performed until a step of forming the lamella structure NS is to occur.

As illustrated in FIGS. 7 and 8, the second sacrificial block NB2 is removed from the sacrificial structure NS. Accordingly, the first sacrificial block NB1 and the guide pattern GP remain disposed on the cylinder structure SS, i.e., the first thin film.

The second sacrificial block NB2 may be removed via any suitable manufacturing process, such as wet etching. For example, if the substrate 110 including the sacrificial structure NS is immersed in a solution including, for instance, an acetic acid and then subjected to sonication, the second sacrificial block NB2 may be selectively removed (e.g., etched away) from the sacrificial structure NS. As another example, the second sacrificial block NB2 may be removed via dry etching. For example, after one or more light treatments (e.g., ultraviolet ray treatment(s)) are performed on the sacrificial structure NS, the second sacrificial block NB2 may be selectively removed via reactive ion etching (RIE) by a difference in etching selectivity.

Once the second sacrificial block NB2 is removed, an upper surface of the mother pattern layer 200 may be stripped by etching the cylinder structure SS and the neutralization layer 120 using the first sacrificial block NB1 and the guide pattern GP as a mask to control the stripping process(es). In this manner, the mother pattern layer 200 may be patterned by removing the exposed portions of the upper surface of the mother pattern layer 200.

After the mother pattern layer 200 is patterned, the first sacrificial block NB1, the guide pattern GP, and the cylinder structure SS are removed via any suitable manufacturing process(es). For example, the substrate 110 including the first sacrificial block NB1, the guide pattern GP, and the cylinder structure SS may be immersed in a solution including, for instance, toluene or the like, and then subjected to sonication to remove the first sacrificial block NB1, the guide pattern GP, and the cylinder structure SS.

Figure 9:
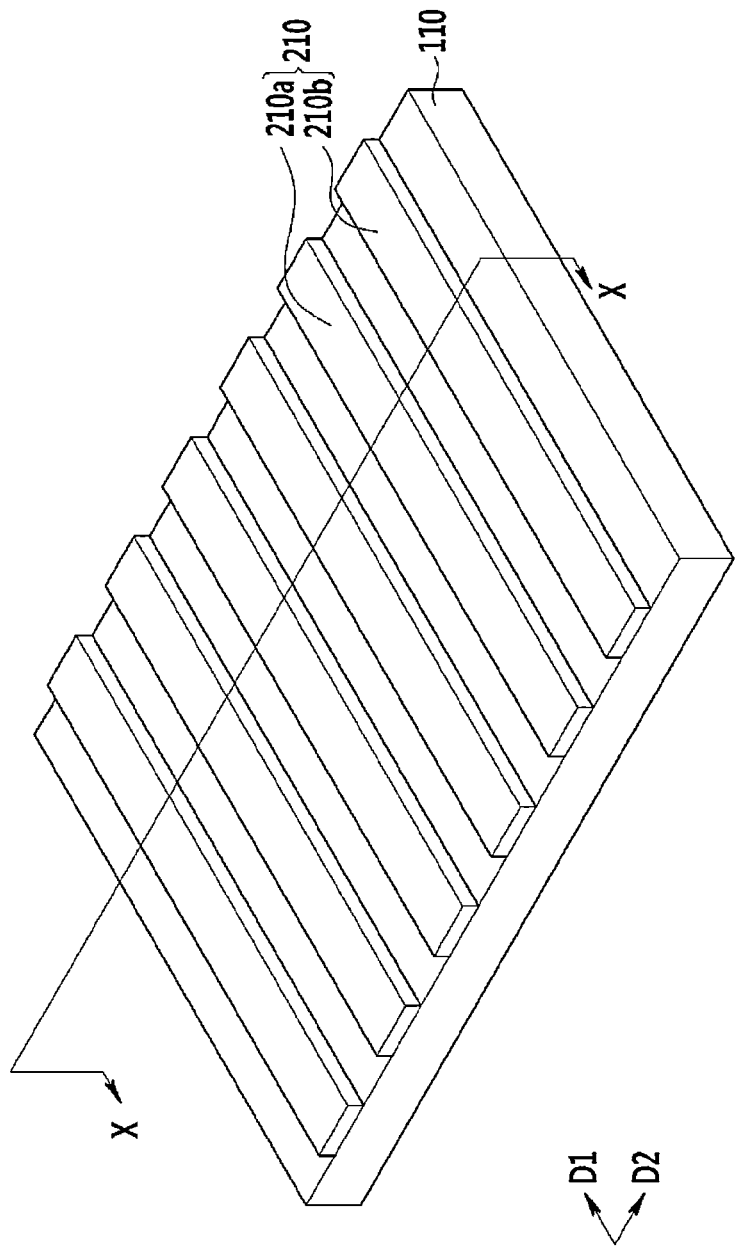
FIG. 9 is a perspective view of the pattern formed via the nanostructure of FIG. 1, according to exemplary embodiments.
Figure 10:
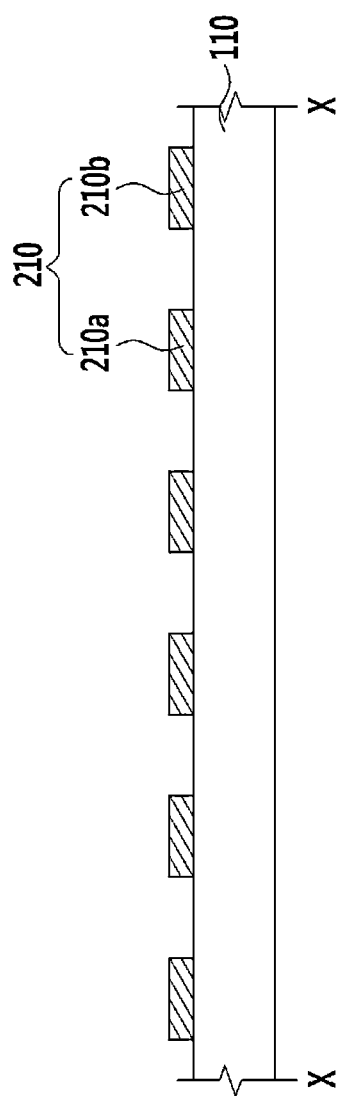
FIG. 10 is a cross-sectional view of the nanostructure of FIG. 9 taken along sectional line X-X, according to exemplary embodiments.

FIG. 9 is a perspective view of the pattern formed via the nanostructure of FIG. 1, according to exemplary embodiments. FIG. 10 is a cross-sectional view of the nanostructure of FIG. 9 taken along sectional line X-X.

The pattern illustrated in FIGS. 9 and 10 may be a metal pattern that may be utilized as a polarizer. Referring to FIGS. 9 and 10, the mother pattern layer 200 is patterned using the aforementioned nanostructure to form a linear lattice pattern 210 including a first line 210a and a second line 210b formed on the substrate 110.

The first and second lines 210a and 210b extend in the first direction D1 of the substrate 110. That is, the first and second lines 210a and 210b have respective longitudinal axes that extend parallel or substantially parallel to the first direction D1. In this manner, the second line 210b is spaced away from the first line 210a in the second direction D2 that is different from the first direction D1, e.g., perpendicular (or substantially perpendicular) to the first direction D1. The first and the second lines 210a and 210b may include one or more reflective metallic materials, such as, for example, aluminum (Al), silver (Ag), platinum (Pt), and/or the like.

According to exemplary embodiments, the mother pattern layer 200 is patterned by forming the cylinder structure SS including the first block copolymer, and the lamella structure NS including the second block copolymer using the block copolymer, and thus, forming the linear lattice pattern 210. Accordingly, the nano-sized linear lattice pattern 210 exhibiting highly aligned nanostructures may be formed on the substrate 110, which may include a large surface area to improve manufacturing reliability and productivity of the above-noted polarizer.

Figure 11:
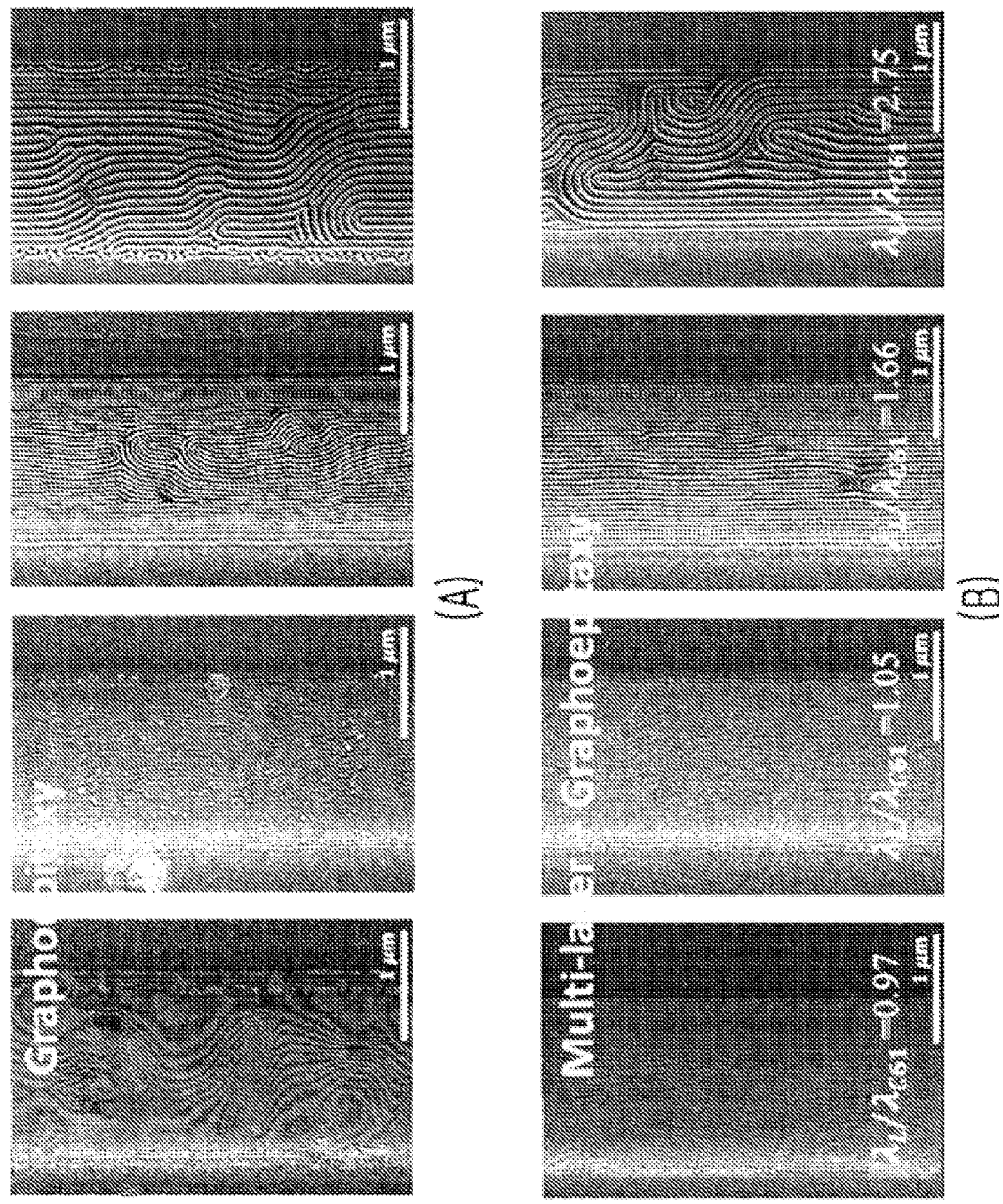
FIG. 11A illustrates alignment of nanostructures fabricated according to a conventional process.
FIG. 11B illustrates alignment of nanstructures when a lamella-type block copolymer is formed on a cylinder-type block copolymer, according to exemplary embodiments.

FIG. 11 is illustrates alignment of nanostructures when a lamella-type block copolymer is formed on a cylinder-type block copolymer, according to exemplary embodiments.

FIG. 11A illustrates an alignment pattern obtained after guide patterns and a block copolymer disposed therebetween are formed on a substrate and subjected to heat treatment in a conventional process, and FIG. 11B illustrates an alignment pattern obtained after guide patterns and a block copolymer disposed therebetween are formed on a block copolymer of a cylinder structure and subjected to heat treatment according to exemplary embodiments.

As can be seen by comparing FIGS. 11A and 11B, the alignment of the nanostructures in FIG. 11B is increased. Further, referring to FIG. 11B, $\lambda_{c61}$ represents the aforementioned first interval, and $\lambda_L$ represents the second interval. As a test result, it was confirmed that the alignment is increased as the ratio of the first interval and the second interval converges on 1:1.

While certain exemplary embodiments and implementations have been described herein, other embodiments and modifications will be apparent from this description. Accordingly, the invention is not limited to such embodiments, but rather to the broader scope of the presented claims and various obvious modifications and equivalent arrangements.

What is claimed is:

1. A method of manufacturing a nanostructure, comprising:
    forming a first thin film comprising a first block copolymer on a substrate, the first block copolymer comprising cylinders spaced apart from one another by a first interval;
    forming a guide pattern on the first thin film;
    forming a second thin film comprising a second block copolymer between portions of the guide pattern; and
    curing the second thin film to form a sacrificial structure comprising a first sacrificial block and a second sacrificial block spaced apart from one another by a second interval,
    wherein the second block copolymer is a lamella block copolymer, and
    wherein a ratio between the first interval and the second interval is approximately 1:1.

2. The method of manufacturing a nanostructure of claim 1, wherein the guide pattern comprises photoresist.

3. The method of manufacturing a nanostructure of claim 2, wherein the first block copolymer comprises a cross-linked material.

4. The method of manufacturing a nanostructure of claim 3, wherein the cross-linked material comprises at least one of ketene, azide, and benzocyclobutene (BCB).

5. The method of manufacturing a nanostructure of claim 3, wherein the second block copolymer comprises:
    polystyrene-block-polymethylmethacrylate (PS-b-PMMA);
    polystyrene-block-polyethyleneoxide (PS-b-PEO);
    polystyrene-block-poly-2-vinyl pyridine (PS-b-PVP);
    polystyrene-block-polydimethylsiloxane (PS-b-PDMS);
    polystyrene-block-polyferrocenyldimethylsilane (PS-b-PFS); or polystyrene-block-polyisoprene (PS-b-PI).

6. The method of manufacturing a nanostructure of claim 3, further comprising:
    treating the first thin film via ultraviolet irradiation or heat.

7. The method of manufacturing a nanostructure of claim 1, further comprising:
    forming an intermediate layer on the substrate, the intermediate layer being disposed between the substrate and the first thin film.

8. The method of manufacturing a nanostructure of claim 1, wherein the cylinders of the first block copolymer form a hexagonal unit body.

9. A method of forming a pattern of nanostructures, comprising:
    forming a first thin film comprising a first block copolymer on a target pattern layer, the first block copolymer comprising cylinders spaced apart from one another by a first interval, the target pattern layer being disposed on a substrate;
    forming a guide pattern on the first thin film;
    forming a second thin film comprising a second block copolymer between portions of the guide pattern;
    curing the second thin film to form a sacrificial structure comprising a first sacrificial block and a second sacrificial block spaced apart from one another by a second interval;
    removing the first sacrificial block from the sacrificial structure; and
    patterning the first thin film and the target pattern layer using the second sacrificial block and the guide pattern as a mask,
    wherein the second block copolymer is a lamella block copolymer, and
    wherein a ratio between the first interval and the second interval is approximately 1:1.

10. The method of forming a pattern of nanostructures of claim 9, wherein the guide pattern comprises photoresist.

11. The method of forming a pattern of nanostructures of claim 10, wherein the guide pattern comprises a photoresist pattern portion extending in a first direction, the photoresist pattern portion being formed in a repeated arrangement along a second direction different from the first direction.

12. The method of forming a pattern of nanostructures of claim 11, wherein the first block copolymer comprises a cross-linked material.

13. The method of forming a pattern of claim 12, wherein the cross-linked material comprises at least one of ketene, azide, and benzocyclobutene (BCB).

14. The method of forming a pattern of nanostructures of claim 12, wherein the second block copolymer comprises:
    polystyrene-block-polymethylmethacrylate (PS-b-PMMA);
    polystyrene-block-polyethyleneoxide (PS-b-PEO);
    polystyrene-block-poly-2-vinyl pyridine (PS-b-PVP);
    polystyrene-block-polydimethylsiloxane (PS-b-PDMS);
    polystyrene-block-polyferrocenyldimethylsilane (PS-b-PFS); or polystyrene-block-polyisoprene (PS-b-PI).

15. The method of forming a pattern of nanostructures of claim 12, further comprising:
    treating the first thin film via ultraviolet irradiation or heat.

16. The method of forming a pattern of nanostructures of claim 9, further comprising:
forming an intermediate layer on the target pattern layer, the intermediate layer being disposed between the target pattern layer and the first thin film.

17. The method of forming a pattern of nanostructures of claim 9, wherein patterning the target pattern layer forms a linear lattice formation.

18. The method of forming a pattern of claim 17, wherein the target pattern layer comprises one or more reflective metallic materials.

19. The method of forming a pattern of claim 9, wherein the cylinders of the first block copolymer form a hexagonal unit body.

* * * * *